United States Patent [19]
Sawin et al.

[11] Patent Number: 6,083,413
[45] Date of Patent: Jul. 4, 2000

[54] METALS REMOVAL PROCESS

[75] Inventors: Herbert H. Sawin, Chestnut Hill; Jane P. Chang, Cambridge, both of Mass.; Andrew Scott Lawing, Phoenix, Ariz.; Zhe Zhang, Irvine, Calif.; Han Xu, Lexington, Mass.

[73] Assignee: Massachusetts Institute of Technology, Cambridge, Mass.

[21] Appl. No.: 09/051,686

[22] PCT Filed: Oct. 18, 1996

[86] PCT No.: PCT/US96/16731

§ 371 Date: Oct. 1, 1998

§ 102(e) Date: Oct. 1, 1998

[87] PCT Pub. No.: WO97/15069

PCT Pub. Date: Apr. 24, 1997

Related U.S. Application Data

[60] Provisional application No. 60/005,622, Oct. 19, 1995.

[51] Int. Cl.$^7$ ..................................................... B44C 1/22
[52] U.S. Cl. ........................... 216/104; 216/107; 216/109
[58] Field of Search .................................. 216/104, 107, 216/109

[56] References Cited

U.S. PATENT DOCUMENTS

| | | | |
|---|---|---|---|
| 4,498,953 | 2/1985 | Cook et al. | 156/646 |
| 4,741,800 | 5/1988 | Yamazaki | 156/643 |
| 5,318,668 | 6/1994 | Tamaki et al. | 156/662 |
| 5,350,480 | 9/1994 | Gray | 156/345 |
| 5,356,514 | 10/1994 | Kinoshita | 156/543 |
| 5,380,370 | 1/1995 | Nino et al. | 134/22.11 |
| 5,431,774 | 7/1995 | Douglas | 216/57 |
| 5,534,107 | 7/1996 | Gray et al. | 156/643.1 |
| 5,725,677 | 3/1998 | Sugino et al. | 134/1 |
| 5,814,156 | 9/1998 | Elliott et al. | 134/1 |

FOREIGN PATENT DOCUMENTS 1180187 2/1970 United Kingdom .

OTHER PUBLICATIONS

Yamaguchi et al, "Thermal desorption spectroscopy and molecular beam time–of–flight studies os silicon wafer ultraviolet/ozone cleaning", J. Vac. Sci. Technol. B, vol. 15, No.2, Mar./Apr. 1997.

Ito et al, "Surface Treatment with UV–excited radicals for highly–reliable gate dielectrics", abstract from Conference Science and Technology Surface Preparation, *Material Resource Society*, Pittsburgh, PA USA, Apr. 1997.

Courtney, C.H. et al, "Ni Removal from Si wafers by low–pressure UV–chlorine cleaning", abstract from Conference Title Science and Technology fo Semiconductor Surface Preparation, *Material Residence Society*, Pittsburgh, PA, Apr. 1997.

Lawing et al, "UV/CL/sub 2/ etching and cleaning of wafer surfaces", abstract from Conference Proceedings of the Fourth International Symposium on Cleaning Technology in Semiconductor Device Manufacturing Pagination; p. 150–7, *Electrochem Society*; Pennington NJ, Oct. 1995.

PTO form 892 of.

Sugino et al, "Dry Cleaning for Fe Conaminants on Si and $SiO_2$ Surfaces with Silicon Chlorides", *J. Electrochem. Soc.*, vol. 144, No. 11, pp. 3984–3988, Nov. 1997.

Sugino et al, "Fe Removal Effects of Silicon Chlorides ($SiCl_x$) During $UV/CL_2$ Dry Cleaning", Electrochemical Society Proceedings vol. 97–35 p. 292–299.

Aoyama et al, "Removing native oxide from Si(001) surfaces using photoexcited fluorine gas", *Appl. Phys. Lett.* , p. 2576–2578; Nov. 1991.

Takashi Ito, "Wafer claning with Photo–Excited Halogen Radical", *Proceediings–Institute of Environmental Sciences*, p. 808–811, 1991.

Sugino et al, "Dry Cleaning of Si and $SiO_2$ Surfaces using $SiCL_4$ System", *Proceedings, International Symposium on Semiconductor Manufacturing–ISSm '95*, p. 262–265, 1995.

Aoyama et al, Surface Cleaning for Si Ephraxy Using Photoexcited Fluorine Gas:, *J. Electrochem Soc.*, vol. 140, p. 366–371, Feb. 1993.

Ibbotson et al, "Selective interhalogen etching of tantalum compounds and other semiconductor materials", *Appl. Phys. Lett.*, p. 794–796, 1985.

Ibbotson et al, "Plasmaless dry ething of silicon with fluorine–containing compounds", *J. Appl. Phys.*, p. 2939–2942, Nov. 1984.

Aoyama et al, "Silicon Surface cleaning Using Photexcited Fluorine Gas diluted with Hydrogen", *J. Electrochem. Soc.* vol. 140, Jun. 1993.

*Primary Examiner*—Edward J. Cain
*Attorney, Agent, or Firm*—Vidas, Arrett & Steinkraus

[57] ABSTRACT

A process for removing metallic material, for instance copper, iron, nickle and their oxides, from a surface of a substrate such as a silicon, silicon oxide or gallium arsenide substrate. The process includes the steps of: a) placing the substrate in a reaction chamber; b) providing in the reaction chamber a gas mixture, the mixture comprising a first component which is fluorine or a fluorine-containing compound, which will spontaneously dissociate upon adsorption on the substrate surface and a second component which is a halosilane compound, the halosilane, and the fluorine if present, being activated by: i) irradiation with UV; ii) heating to a temperature of about 800° C. or higher; or iii) plasma generation, to thereby convert said metallic material to a volatile metal-halogen-silicon compound, and c) removing the metal-halogen-silicon compound from the substrate by volatilization. The process may be used to remove both dispersed metal and bulk metal films or islands.

26 Claims, No Drawings

METALS REMOVAL PROCESS

The application claims benefit of U.S. provisional application 60/005,622, filed Oct. 19, 1995.

BACKGROUND OF THE INVENTION

Trace metal removal is a critical step in the semiconductor fabrication process. Trace metal contamination has been shown to be a factor in limiting device yields. Metallic contamination impacts device performance by degrading gate oxide quality, leakage current density and minority carrier lifetime. Currently, most metal removal is achieved with wet chemical cleaning techniques such as the "RCA" clean and liquid phase HF. These processes have served the industry well for many years, and a recent resurgence of interest in cleaning techniques has led to a further refinement of wet cleaning technology. However, there is some concern that wet cleaning techniques will have increasing difficulty in cleaning future generation devices, with ever shrinking dimensions, because of surface tension effects. The predicted shift to single wafer, clustered processing also raises concern since wet cleaning processes are typically batch processes and are incompatible with the vacuum environment in which clustered process are performed.

Gas phase, or "dry" wafer cleaning processes can potentially replace wet cleaning and be more effective in a reduced device dimension clustered processing environment. Developing dry etching process for etching metals and removing metal contaminants, particularly copper nickel and iron or oxidized compounds thereof, is therefore desired. In evaluating such processes surface termination, roughness, and residues are the few major factors used to assess the feasibility of dry cleaning processes.

Silicon or germanium etching using unactivated fluorine interhalogens such as $ClF_3$ is reported in GB 1180187 and lbbotson, et al., *Appl. Phys. Lett.* 44, 1129 (1984). Etching of silicon, tantalum, and certain tantalum compounds, selectively relative to silicon oxide, tantalum oxide and silicon nitride, is reported in U.S. Pat. No. 4,498,953; Ibbotson, et al, "Plasmaless Dry etching of silicon with fluorine-containing compounds," *J. Appl. Phys.*, 56, pp 2939–2942, (1984); and Ibbotson, et al, "Selective interhalogen etching of tantalum compounds and other semiconductor materials," *Appl. Phys. Lett*, 46, Apr. 15, 1985, pp 794–796.

Several authors at Fujitsu Laboratories, Ltd., have produced publications describing a $UV/Cl_2$ process for cleaning metal contamination from silicon wafer substrates and $UV/F_2/Ar$ and $UV/F_2/H_2$ processes for etching silicon oxide. These publications include T. Ito, "Wafer cleaning with photo-excited halogen radical," *Proceedings—Institute of Environmental Sciences*, 1991, pp 808–813; Aoyama et al, "Removing native oxide from Si(001) surfaces using photoexcited fluorine gas," *Appl. Phys. Lett.*, 59, November 1991, pp 2576–2578; Aoyama et al, "Silicon Surface Cleaning Using Photoexcited Fluorine Gas Diluted with Hydrogen," *J Electrochem. Soc.*, 140, 1704–1708 (1993); and Aoyama et al, "Surface Cleaning for Si Epitaxy Using Photoexcited Fluorine Gas," *J Electrochem. Soc.*, 140, 366–371 (1993); and U.S. Pat. No. 5,178,721. In their published work these authors observed that the $UV/F_2/Ar$ process, at the temperatures they investigated, did not remove iron and that the $UV/Cl_2$ process required substrate temperatures in excess of 140° C. to remove iron. It has also been reported that these authors observed that copper was not removed by their $UV/Cl_2$ process unless a bare silicon wafer was also placed in the reactor.

In Sugino, et al, *Proceedings ISSM'95* 262–265 (1995), a report published subsequent to the invention of the present invention, Fujitsu investigators report that the $UV/Cl_2$ process is also not completely effective for removing metals from $SiO_2$ substrates; that iron is removed from Si and $SiO_2$ substrates using $UV/SiCl_2$ and substrate temperatures in excess of 350° C.; and that on Si substrates the efficiency of removal is increased with a small addition of $Cl_2$.

In U.S. Pat. No. 5,350,480 there is described an apparatus for generating directed beams containing thermally excited, electrically neutral gas species. The apparatus is reported to be capable of removing metal contaminants from semiconductor material substrates when a $ClF_3$ beam is used. Other devices for producing such beams are described in references cited in U.S. Pat. No. 5,350,480. Whether produced by the apparatus of U.S. Pat. No. 5,350,480 or otherwise, beams of thermally excited, electrically neutral gas species (thermal beams) are considered interesting due to their ability to achieve highly anisotropic and almost damage-free etching profiles. The present inventors, however, have found that while dispersed transition metals, such as copper, nickel and iron, or their oxides, can be removed from a silicon surface maintained at ambient temperature using $ClF_3$ alone, discrete islands of copper are not effectively removed under the same process.

SUMMARY OF THE INVENTION

The invention is a process for the cleaning of surfaces by means of reacting the surface contaminants to form volatile species. Specifically the invention is a process for removing metallic material from a substrate, the metallic material being a metal selected from the group consisting of metals of the periodic table groups 4–13 (new IUPAC designation as set forth on inside front cover of CRC Handbook of Chemistry and Physics 73rd Ed., 1992–1993) and oxidized metal compounds thereof. The substrate may be a semiconductor material such as silicon, a silicon oxide or gallium arsenide.

In one aspect the process comprises the steps of:
a) placing the substrate in a reaction chamber;
b) providing in the reaction chamber an activated gas mixture, the mixture comprising a first component which is fluorine or a fluorine-containing compound which will spontaneously dissociate upon adsorption on the substrate surface and a second component which is a halosilane compound, the halosilane, and the fluorine if present, being activated by:
   i) irradiation with UV;
   ii) heating to a temperature of about 800° C. or higher; or
   iii) plasma generation, preferably followed by removal of ionic species,
to thereby convert said metallic material to a volatile metal-halogen-silicon compound, and
c) removing the metal-halogen-silicon compound from the substrate by volatilization.

In another aspect, the process of the invention comprises the steps of:
a) placing the substrate in a reaction chamber;
b) providing in the reaction chamber:
   i) a reactive halogen component comprising a fluorine-containing compound which will spontaneously dissociate upon adsorption on the substrate surface, a neutral monoatomic fluorine, chlorine, bromine, or iodine species, or a mixture thereof, preferably $ClF_3$ or a monoatomic fluorine species, and ii) a gas-phase reactive silicon-containing species which is an activated halosilyl radical, a vibrationally excited silicon compound or a silicon compound having an unfilled orbital on the silicon atom thereof, to thereby convert said metallic material to a volatile metal-halogen-silicon compound; and c) removing the metal-halogen-silicon compound from the substrate by volatilization.

With regard to the latter aspect of the invention the two components i) and ii) are typically provided simultaneously. However when the halogen species i) is a fluorine-containing compound such as $ClF_3$ which will dissociate upon adsorbtion on the substrate surface, it is also practical to first provide the gas-phase reactive silicon-containing species ii), followed by treatment with the dissociable fluorine-containing compound.

With regard to both aspects of the invention, the substrate is preferably maintained at a temperature of no more than 300° C., more preferably no more than 250° C., and still more preferably between about ambient room temperature and about 100° C., throughout the process. Additionally, the providing step b) and the product removing step c) may be run concurrently in a flowing vacuum system or an atmospheric pressure system or sequentially, providing the reactive halogen species and reactive silicon species to a static chamber containing the substrate and subsequently evacuating the chamber to volatilize and remove the metal-halogen-silicon compound. Preferably steps b) and c) are run in flowing gas regime maintained at a pressure of below 10 Torr, and especially below 500 mTorr.

In particularly advantageous embodiments of the invention, it has been demonstrated that volatile compounds of copper, nickel, and iron can be created by reaction with reactive species formed by thermally decomposing dichlorosilane and fluorine in a hot beam source or by UV irradiation. The reactive species in this case are believed to be $SiCl_2$ and monoatomic fluorine.

Further aspects of the invention are described in the following Detailed Description of the Invention and the Claims.

DETAILED DESCRIPTION OF THE INVENTION

The reactive halogen component may be a fluorine-containing compound which will spontaneously dissociate upon adsorption on the substrate surface. $XeF_2$ and $ClF_3$ are suitable such compounds. It is not necessary to activate these compounds prior to reaction with the substrate surface as they will generate F radical upon adsorption on the substrate surface. The reactive halogen component may also be a monoatomic fluorine, chlorine, bromine or iodine species which is generated by activation of a halogen-containing compound in a reactive neutral beam generator. Suitable source gases for generating monoatomic halogen species include fluorine, fluorine interhalogens such as $ClF_3$ and $BrF_3$, $SF_6$ or other fluorides of sulfur, $Cl_2$, $Br_2$, $I_2$, $NF_3$, $XeF_2$, etc. source gas may also be a mixture of halide gases such as mixtures of fluorine containing gases with chlorine, for instance $F_2/Cl_2$, $ClF_3/Cl_2$ or $BrF_3/Cl_2$ mixtures.

The source of reactive silicon species may be a gaseous compound of the formula $SiX_nR_m$ where m is 0–2, n is 2–4, R is H or a hydrocarbon group such as alkyl, alkenyl or aryl, and X is F, Cl, Br, I or mixtures thereof. Disilanes, trisilanes or other compounds which can be pyrolyzed or photolyzed to give a volatile silicon species may also be used. The silicon compound is most desirably fragmented and provided to the substrate in the form of a halosilyl radical or neutral silicon-containing moiety having an unfilled orbital on the silicon atom thereof. Vibrational excitation of some silicon compounds which does not fragment the molecule can also be employed in some cases to generate an activated species which will react with the reactive halogen component and the metal or oxidized metal on the substrate surface to form the desired volatile metal-silicon-halogen compound. The reactive silicon-containing species is suitably generated from a silicon-containing halosilyl compound using a neutral beam generator. Specific examples of silicon compounds which may be employed as the source of the reactive silicon species include dichlorosilane, silicon tetrafluoride, silicon tetrachloride, difluorosilane, trichlorosilane, and trifluorosilane.

A plasma generator may also be used to produce the reactive halogen and reactive silicon species. Plasma generators, however, produce energetic ionic species in addition to activated neutral species. Such ionic species, in general, are considered undesireable as they may become incorporated into the substrate at or below the surface thereof. Accordingly, it is preferred that a plasma generator be located upstream of the reaction chamber, with the ionic components of the plasma being removed before the activated gas is injected into the reaction chamber.

Most suitably the reactive halogen species is monoatomic fluorine and the reactive silicon species is a pyrolysis or UV irradiation product obtained from a chloro or fluoro silane. Such systems allow for room temperature removal of metals such as copper and iron from semiconductor substrates. However, at higher volatilization temperatures, systems in which the halogen atoms of the halide radical and the halosilyl radical are all chlorine or even bromine or iodine may be suitable, particularly at volatilisation temperatures above about 250° C. Metals which are particularly difficult to remove, especially nickel, can also be removed by the process of the invention although with UV activation complete removal may require higher than ambient room temperature. Based on ambient temperature results it appears that nickel can be completely removed in a UV process using substrate temperatures of less than 100° C., possibly as low as 50° C., using optimized gas ratio and pressure conditions.

Suitable reactive neutral beam generators which may be used to generate the reactive halogen and the reactive silicon species include:

a "hot beam" pyrolysis apparatus such as disclosed in U.S. Pat. No. 5,350,480 to Gray entitled "Surface Cleaning Using Hot Neutral Gas Beam Array," and references cited therein;

a UV irradiation source which produces UV irradiation in the wavelength range of 180 to 600 nm, such as described in copending U.S. applications Ser. No. 08/259,542, filed Jun. 14, 1994, and Ser. No. 08/360,382, filed Dec. 21, 1994 and in R. Sugino, et. al., International Symposium on Semiconductor Manufacturing, IEEE (1995), pgs 262–265, or a vacuum UV source which produces UV irradiation in the wavelength range of 90–180 nm; and a downstream plasma source for neutral plasma beams, optionally combined with a UV irradiation source, such as disclosed in U.S. Pat. No. 4,687,544 to Bersin, (all of which references are incorporated herein by reference), using one or more gaseous compounds which will dissociate in the neutral beam generator to the desired reactive radical or other neutral reactive species.

The invention is particularly advantageous for removing bulk copper, for instance for etching lines after copper deposition on VLSI devices. Directed neutral beams allow for very tight control of the etch process and neutral beams, particularly those generated by thermal pyrolysis or UV irradiation, can be adjusted to produce little collateral damage to the substrate when composed in accordance with the present invention. Other specific metals which may be removed by the process of the invention include Al, Cr, Co, Au, Ag, Pt. Pd, and Hg.

The metallic material may be in oxidized state, such as in form of an oxide of the metal, prior to removal. Unoxidized metal is preferred.

Applications for the inventive process include:

Precleans for gate oxide growth/Epitaxy

Post clean for RIE processes

General cleans for microelectronics

Pattern etching and other bulk etching of thin film metals such as Cu

Post RIE Metal Pattern clean to reduce corrosion

In the inventive process halosilanes such as $SiCl_2H_2$ (DCS) can react with copper and form volatile compounds, however, it can deposit SiClx on wafer surface which prevents further metal removal. If such deposition occurs, subsequent treatment with $ClF_3$, or $XeF_2$, can etch away all of the SiClx deposition and put the copper in a form which can completely be removed from a wafer surface at room temperature. However due to the extreme reactivity of these halogen gases it is preferred to use an activated $DCS/F_2$ mixture in the process of the invention. The activated mixture, activated by pyrolysis or TV irradiation of a mixture of DCS and $F_2$, can completely remove both dispersed copper and bulk copper without $SiCl_x$, deposition.

For pyrolysis processes, suitable pyrolysis temperatures are above about 800° C., preferably above about 900° C. The reactive beam flux at the substrate surface is suitably one which is equivalent to a partial pressure of reactive species of about 0.1 mTorr to about 2 mTorr. Substrate temperatures of below about 300° C. are suitable, preferably below 250° C. and more preferably from about room temperature to about 100° C.

For UV processes, the partial pressure of the gas mixture of silicon-containing and halogen containing gases (source gas mixture) is suitably below 10 Torr, especially pressures below about 1 Torr, and particularly from about 10 to about 500 mTorr are desirable. As in the case of the pyrolysis process, substrate temperatures of below about 300° C. are suitable, preferably below 250° C. and more preferably from about room temperature to about 100° C. In some reactor configurations the low partial pressure of the source gas mixture may be difficult to control. In such cases total pressure may be increased to a controllable level, without increasing the source gas partial pressure, by adding an inert gas such as nitrogen to the gas mixture. The UV irradiation can be accomplished in a manner so that the UV light impinges on both the gas mixture and the substrate, or in a manner so that it impinges only on the gas mixture.

The same conditions of pressure, temperature which are suitable in UV processes are suitably employed in plasma processes.

The reactive gas species are desireably provided in a flowing system so that reaction product gases are continuously removed.

Metal etch has been demonstrated over a wide range of ratios of halosilane to halogen gas. In particular DCS to $F_2$ ratios of from about 10:1 to about 1:12 have been demonstrated to give effective etch with several metals. In general fluorine-rich ratios are preferred to minimize or eliminate the deposition of SiClx. In such regimes, pressures at the lower end of the ranges specified above are desireable to minimize fluorine incorporation in the substrate.

The invention is illustrated by the following non-limiting examples.

EXAMPLES

All experiments were run in a cluster apparatus which allowed for samples, after introduction via a load lock device, to be contaminated or overcoated with a sputter deposited metal, moved to a reaction chamber, treated and moved to an XPS (X-ray Photoelectron Spectroscopy) chamber for analysis, all while maintaining a base pressure in the range of $10^{-7}$ Torr. Surface roughness studies were conducted using an ex situ Atomic Force Microscopy (AFM) apparatus. The etching and deposition rates were measured by laser interferometry or estimated from XPS intensity data.

Thermal Beam Experiments

The thermal beam source was constructed to generate neutral radicals pyrolytically. The beam consisted of an alumina tube for introducing gas, a coiled heating filament, a cooling water jacket and a thermocouple for temperature control and measurement. Up to tree individual beams could be directed on the sample at the same time. Gases such as chlorotrifluoride ($ClF_3$), and chlorine ($Cl_2$) were fed into the device as indicated in the specific examples. Feed gas could be heated to as high as 1000° C. to dissociate or excite the gas molecules or could be fed into the reaction chamber at ambient room temperature. Unless otherwise indicated, the beam flux at the substrate surface in all thermal beam examples was equivalent to a gas pressure of about 0.5 mTorr.

Up to 15 monolayers of copper could be sputter deposited on the sample surface using a 3 kV Ar ion beam. The copper target was biased at 1.2 kV. The amount of copper deposited on the sample surface is controlled by deposition time and detailed calibration can be found in the report of A. S. Lawing, et al., Electrochemical Society Proceedings (1995). Except as indicated the experiments reported in the following examples utilized a copper deposition level of 0.5 monolayer.

Both n-type and undoped polysilicon samples were studied in this work. Silicon samples with native oxide were pre-cleaned by ethanol before position into the chamber. Appreciable amounts of carbon contamination were observed under XPS analysis. A clean silicon surface was generally produced by in situ argon ion sputtering to remove the native oxide.

Comparative Example A ($ClF_3$)

A $ClF_3$ beam at room temperature was used to remove metal contamination. $ClF_3$ is a chemical species which can dissociatively adsorb on a surface at room temperature to release fluorine. $ClF_3$ gas (99.0% pure) was used in this work and the flux level was approximately $5 \times 10^{17}$ cm$^{-2}$ s$^{-1}$ (equivalent to a gas pressure of approximately 0.5 mTorr at the substrate surface).

With deposits of greater than about 0.5 monolayer XPS studies of sputtered copper deposits on silicon indicated that sputtered copper formed islands on the surface, rather than being uniformly disersed on the surface.

XPS studies of Cu(2p) emissions from undoped polysilicon samples with sputter deposited copper subjected to a $ClF_3$ room temperature beam showed that a portion of the copper deposit could be readily removed at an exposure time which achieved very low Si etch, but that the copper removal thereafter remained flat so that exposure time increases producing more than 10 times the Si etch depth did not result in a significant further percentage reduction in the Cu signal. A similar plateau was obtained when the substrate temperature was increased from 20° C. to 250°. Similarly when beam flux intensity was varied by a factor of two a flat Cu etch percentage result, regardless of Si etch depth, was observed.

XPS signals for the Cu(2p) emission for two different dosages of copper indicated that approximately 21% of the copper was not removed with a dosage of 3 monolayer of copper and that approximately 35% of the copper was not removed with a dosage of 15 monolayers of copper. In both cases, 25 nm of polysilicon was etched Single crystal silicon samples with sputter deposited Cu thereon were etched with $ClF_3$ and Atomic Force Microscopy was performed to measure the roughness of the surface after etching. The surface was quite smooth with the exception of several spikes.

These various experiments were all consistent with the conclusion that dispersed copper is etched but bulk copper islands are not substantially etched by $ClF_3$.

Comparative Example B—$SiH_2Cl_2$ (DCS) with $SiO_2$ Substrate

A treatment to remove copper from a silicon oxide surface at room temperature was performed using a dichlorosilane (DCS) hot neutral beam. Pyrolysis of DCS was achieved in this process at a temperature of 1000° C. Copper contamination on the order of half a monolayer was sputter deposited on a native oxide surface. Silicon deposition was calibrated by laser interferometry method to be 100 Å/min and could be varied by 25% by adjusting the flowrate and temperature. The thickness of the deposited DCS film was calculated based on the attenuation of the XPS signal of oxygen spectrum. A mean free path of 20 Å was used for photo-electron for oxygen. The percentage of copper removal was then corrected accordingly.

Approximately 65–80% of the deposited copper was removed from the oxide surface using DCS alone. Complete removal was not observed with exposure to DCS beam alone. It was observed that DCS exposure times as short as 1–3 sec produced approximately 5–10 Å deposition of $SiCl_2$ film. It was concluded that the deposited silicon film was preventing further reaction with copper and therefore keeping the volatile species embedded.

Example 1 $SiH_2Cl_2$ (DCS)/$ClF_3$

Utilizing $ClF_3$ after DCS treatment was then pursued to etch the deposited silicon film together with the copper remaining on the surface. Using a sequential DCS deposition and $ClF_3$ etching process, all the measurable copper was removed and the surface was found to be highly terminated by fluorine.

The AFM scan of the etched sample showed no copper island features after this process and no surface roughening by this process.

The most important aspect of this DCS/$ClF_3$ process is its ability to achieve complete metal removal with the sample at room temperature. Lower sample process temperatures are preferred in semiconductor fabrication due to the fact that higher temperature can induce diffusion which in turn significantly influence the quality and performance of the device.

However, $ClF_3$ is hard to handle due to its extreme reactivity. It was therefore proposed to use $Cl_2$ to inhibit the deposition rate of DCS during the cleaning process, since chlorine atom has been shown to etch N-type polysilicon spontaneously.

Example 2 $SiH_2Cl_2$ (DCS)/$Cl_2$

Chlorine was then added in DCS to make a non-depositing source to remove copper. Deposition rate was measured by laser interferometry. Copper contannation on the order of half a monolayer was again used. The silicon deposition rate was slowed down by a factor of 2 at $Cl_2$:DCS=1:1, and a factor of greater than 4 at $Cl_2$:DCS=4:1. However, non-depositing conditions were not achieved at chlorine to DCS ratio as high as six. Further, the efficiency of Cu removal is not substantially better than using DCS alone. Therefore this is a less preferred embodiment of the invention. The surface is terminated with chlorine after the process.

Example 3 $SiH_2Cl_2$ (DCS)/$F_2$

Fluorine was then utilized due to the distinct copper removal efficiency between DCS/$ClF_3$ and DCS/$Cl_2$. $F_2$ at approximately 1000° C. was first used to remove copper after depositing silicon using DCS. In this sequential process, fluorine failed to further remove the remaining copper nor the deposited DCS on the surface. The surface after DCS deposition is likely stabilized to a state that fluorine atom could not attack.

Fluorine was then mixed with DCS at a 1:1 volume ratio and heated up to 1000° C. to remove copper. Under these conditions no measurable amount of copper was observed after the treatment. However, silicon film deposition was observed. Increasing the $F_2$ flowrate from 1:1 to 1:12 with respect to DCS, however, eliminated the deposited silicon film. The process times employed were about 5–10 sec.

The DCS/$F_2$ process, at high fluorine ratio relative to DCS leaves the surface fluorinated.

Example 4—$SiH_2Cl_2$ (DCS)/$F_2$ for Removal of Other Metals: Ni and Fe

Approximately one monolayer of nickel contamination was sputter deposited on a silicon oxide surface, exposed to a DCS/$F_2$ mixture at a ratio of 1:4. No measurable nickel was detected after this treatment. The sample surface was highly terminated with fluorine.

This DCS/$F_2$ process also applied to remove iron. Approximately one to two monolayer of iron contamination was sputter deposited on an oxide sample, exposed to a DCS/$F_2$ mixture at a ratio of 1:4. XPS spectra for Fe(2p) before and after the cleaning process showed that all of the measurable iron had been removed. Similar results were obtained when the iron was partially oxidized.

Examples 5–21—UV Experiments

Reproducible sub-monolayer trace metal contamination was achieved with a sputter system of the same type described for the thermal beam experiments.

The $SiH_2Cl_2$ used in these experiments was 99.99+% pure from Aldrich Chemical. The $F_2$ used in these experiments was 98% pure from Spectra Gases. The $Cl_2$ used in these experiments was 99.998% pure (Matheson ULSI grade).

The UV reaction chamber consists of a quartz tube through which the gas mixture flows. The sample is located on a fork at the end of a transfer rod inserted axially along the centerline of the tube. A thermocouple is imbedded in the fork such that it is within 0.5 cm of the sample surface. Pressure is controlled via a throttle valve and capacitance manometer with a feedback controller. In some cases $N_2$ was added to bring the total gas pressure to a controllable range.

Various lamp configurations were used in the course of this work A high pressure mercury/xenon arc lamp was used to provide both direct and indirect UV flux. This exposure system consisted of a 1000 watt high pressure Hg-Xe discharge source (Hanovia #977B0010) contained in a lamp house (Spectral Energy LH 151). In the direct configuration, the UV fluence was directed at the wafer surface, in the indirect configuration, the lamp outlet was placed upstream of the sample, and the tube area surrounding the sample was blocked with aluminum foil such that stray light would not strike it In the indirect configuration, the high pressure lamp was used solely to generate reactive species in the gas phase, which would then flow downstream over the wafer surface.

Another lamp configuration, consisting of a medium pressure mercury lamp in a dual parabolic reflector, was used exclusively for downstream processing. In this configuration the lamp was situated in one focus of the reflector, and the tube in the other, effectively "imaging" the lamp in the center of the tube.

Contaminant levels were monitored before and after processing using X-ray Photoelectron Spectroscopy (XPS). Mg Kα radiation and a VG model 100 AX hemispherical electron energy analyzer were used in these experiments. The analyzer was set for a pass energy of 50 eV.

Samples were 1 cm square chips cut from an 8 inch diameter wafer of n-type <100> silicon with a high quality thermally grown oxide of about 3900 Å thickness. The chips were mounted on buttons fabricated of alumina for insertion into the chamber. For oxide surface experiments, the samples were wiped with IPA, rinsed in DI water and blown dry before insertion into the chamber. For bare silicon surface experiments, the samples were stripped of their oxide layer in 50% HF, wiped with IPA and blown dry before insertion into the chamber. Care was taken to insert the bare wafers into the chamber as quickly as possible after the oxide strip to minimize oxide regrowth before the experiment could be performed.

The conditions for all of the runs made in this series of experiments is summarized in Table 1. All of the runs were made with the substrate initially at room temperature. In the case of the direct UV experiments a temperature rise on the order of 10° C./minute was observed. In the case of the downstream experiments, where there was no direct UV fluence to the surface, little or no sample heating was observed over the course of a run. Initial metal coverage for all of the runs was about 0.1 monolayer.

In Table 1, the indicated results for examples 10 and 11 mean that removal was accomplished for the unoxidized iron but not of the oxidized iron.

TABLE 1

Summary of experimental conditions and qualitative removal evaluation

| Example | Surface | Halogen | DCS/X | Reactive Gas Partial Pressure | Direct = X Downstream = ○ | Exposure System | Metal | Run Time (seconds) | Removal |
|---|---|---|---|---|---|---|---|---|---|
| 5 | Si | $F_2$ | 1/10 | 10 Torr | X | High | Iron | 30 | yes |
| 6 | $SiO_2$ | $F_2$ | 1/10 | 10 Torr | ○ | High | Iron | 30 | yes |
| 7 | $SiO_2$ | $Cl_2$ | 1/4 | 100 mTorr | X | High | Iron | 10 | no |
| 8 | $SiO_2$ | $Cl_2$ | 1/10 | 500 mTorr | X | high | Iron | 30 | no |
| 9 | $SiO_2$ | $Cl_2$ | 1/10 | 10 Torr | X | High | Iron | 30 | no |
| 10 | Si | $Cl_2$ | 1/10 | 10 Torr | X | High | Iron | 30 | met = yes ox = no |
| 11 | Si | $Cl_2$ | 0/1 | 9.09 Torr | X | High | Iron | 30 | as above |
| 12 | Si | $Cl_2$ | 1/10 | 10 Torr | X | High | Nickel | 30 | no |
| 13 | Si | $F_2$ | 10/1 | 500 mTorr | X | High | Nickel | 30 | yes |
| 14 | $SiO_2$ | $F_2$ | 10/1 | 500 mTorr | X | High | Nickel | 30 | no |
| 15 | Si | $F_2$ | 10/1 | 500 mTorr | ○ | Medium | Nickel | 90 | yes |
| 16 | Si | $F_2$ | 0/1 | 45 mTorr | ○ | Medium | Nickel | 90 | no |
| 17 | Si | $F_2$ | 1/0 | 455 mTorr | ○ | Medium | Nickel | 90 | no |
| 18 | Si | $F_2$ | 20/1 | 500 mTorr | ○ | Medium | Nickel | 90 | no |
| 19 | Si | $F_2$ | 5/1 | 500 mTorr | ○ | Medium | Nickel | 90 | no |
| 20 | Si | $F_2$ | 10/1 | 500 mTorr | ○ | Medium | Nickel | 60 | yes |
| 21 | Si | $F_2$ | 1/5 | 500 mTorr | ○ | Medium | Nickel | 90 | yes |

UV/DCS/$Cl_2$

Iron and nickel removal were attempted with a UV/DCS/$Cl_2$ process. A range of partial pressures (100 mTorr–10 Torr reactive gas) were explored as listed in Table 1. All of these runs were made with direct UV illumination at composition ratios in the chlorine rich regime. The UV/DCS/$Cl_2$ removes metallic iron but is ineffective in removing oxidized iron. This is important because iron, and to a lesser extent nickel, has been observed to scavenge oxygen from the wafer surface. On a "bare" silicon surface (which is generally characterized by an oxygen surface coverage on the order of ⅓ monolayer) sputtered iron will tend to be partially oxidized, the extent of oxidation being a function of the oxygen surface coverage. On an oxide surface iron will be totally oxidized Also, we found no evidence of nickel removal with the UV/DCS/$Cl_2$ process. Thus with UV activation, as with the thermal beam activation the invention has limited advantage when chlorine gas is used with an ambient temperature substrate.

UV/DCS/$F_2$

Iron and nickel removal were also attempted with UV/DCS/$F_2$. Much better metal removal was achieved with this chemistry.

Iron removal to the detection limit of the XPS was achieved in both a direct and a downstream process.

However, in both the dowram and direct process, significant fluorine incorporation was observed. This fluorine incorporation can be minimized by lowering the reactive gas pressure significantly. The runs reported as Examples 5 and 6 in Table 1 were performed with 10 Torr of reactive gas. Based on the results with nickel removal discussed below, the process will work well and provide minimal fluorine incorporation when the pressure is less than 1 Torr, especially 500 mTorr or less.

With nickel, the initial approach was to attempt removal in the DCS rich regime, combined with a reduction in reactive gas pressure. In this regime, deposition from the reactive gas phase $SiCl_2$ species occurs. The most attractive process conditions were found at about 500 mTorr pressure and at $DCS/F_2$ ratios of 10/1 and 1/5. See Table 1, Example 21. At 500 mTorr and a 1/5 ratio minimal fluorine incorporation was observed and no overlayer was deposited. Nickel removal was effected, although only partially so under the specific parameters of the experiment. An increased substrate temperature from ambient to a temperature in the range of 50° C. to 100° C. will improve nickel removal under these conditions.

In addition to the specific examples given above, those skilled in the art will appreciate that many variations may be made without departing from the invention hereof. For instance optimization of the invention may involve variations in specific gases selected, conditions of gas activation, reaction time, pressure, substrate temperature and gas flow rate none of which should be considered to be outside the scope of the invention as disclosed herein.

We claim:

1. A process for removing metallic material from a surface of a substrate, the metallic material being selected from the group consisting of Group 4–13 elements and oxidized compounds thereof, the process comprising the steps of:
   a) placing the substrate in a reaction chamber;
   b) while maintaining the substrate at a temperature of not more than 250° C., providing in the reaction chamber:
      i) a reactive halogen component comprising a fluorine-containing compound which will spontaneously dissociate upon adsorption on the substrate surface, a neutral monoatomic fluorine, chlorine, bromine, or iodine species, or a mixture thereof, and
      ii) a gas-phase reactive silicon-containing species which is an activated halosilyl radical, a vibrationally excited silicon compound or a neutral silicon compound having an unfiled orbital on the silicon atom thereof,
         to thereby convert said metallic material to a volatile metal-halogen-silicon compound; and
   c) removing the metal-halogen-silicon compound from the substrate by volatiliation.

2. A process for removing metallic material from a surface of a substrate, the metallic material being selected from the group consisting of Group 4–13 elements and oxidized compounds thereof, the process comprising the steps of:
   a) placing the substrate in a reaction chamber;
   b) providing in the reaction chamber:
      i) a reactive halogen component comprising a neural monoatomic fluorine species or a fluorine-containing compound which will spontaneously dissociate upon adsorption on the substrate surface, and
      ii) a gas-phase reactive silicon-containing species which is an activated halosilyl radical, a vibrationally excited silicon compound or a silicon compound having an unfilled orbital on the silicon atom thereof,
         to thereby convert said metallic material to a volatile metal-halogen-silicon compound; and
   c) removing the metal-halogen-silicon compound from the substrate by volatiliation.

3. A process for removing metal material from a surface of a substrate, the metallic material being selected from the group consisting of Group 4–13 elements and oxidized compounds thereof, the process comprising the steps of:
   a) placing the substrate in a reaction chamber;
   b) providing in the reaction chamber a gas mixture, the mixture comprising a first component which is fluorine or a fluorine-containing compound which will spontaneously dissociate upon adsorption on the substrate surface and a second component which is a halosilane compound, the halosilane, and the fluorine if present, being activated by:
      i) irradiation with UV;
      ii) heating to a temperature of about 800° C. or higher, or
      ii) plasma generation,
         to thereby convert said metallic material to a volatile metal-halogen-silicon compound, and
   c) removing the metal-halogen-silicon compound from the substrate by volatiliation.

4. A process for removing metallic material from a surface of a substrate, the metallic material being selected from the group consisting of Group 4–13 elements and oxidized compounds thereof, the process comprising the steps of:
   a) placing the substance in a reaction chamber;
   b) providing in the reaction chamber:
      i) a reactive halogen component comprising a fluorine-containing compound which will spontaneously dissociate upon adsorption on the substrate surface, a neutral monoatornic fluorine, chlorine, bromine, or iodine species, or a mixture thereof, and
      ii) a gas-phase reactive silicon-containing species which is an activated halosilyl radical, a vibrationally excited silicon compound or a neutral silicon compound having an unfilled orbital on the silicon atom thereof,
         to thereby convert said metallic material to a volatile metal-halogen-silicon compound; and
   c) removing the metal-halogen-silicon compound from the substrate by volatilization.

5. A process as in claim 2, 3 or 4 wherein the substrate is maintained at a temperature of about 300°C. or less during formation of said metal-halogen-silicon compound.

6. A process as in claim 2, 3 or 4 wherein the substrate is maintained at a temperature of about 250° C. or less during formation of said metal-halogen-silicon compound.

7. A process as in claim 1, 2, 3 or 4 wherein the metallic material is copper or an oxidized compound thereof.

8. A process as in claim 1, 2, 3 or 4 wherein the metallic material is iron or nickel or an oxidized compound thereof.

9. A process as in claim 1, 2 or 4 wherein said reactive halogen species comprises electrically neutral monoatomic fluorine.

10. A process as in claim 1, 2 or 4 wherein the components i) and ii) are activation products of a gas mixture of a halosilane compound and at least one halogen gas compound selected from the group consisting of $F_2$, $ClF_3$, $BrF_3$, $SF_6$, $Cl_2$, $Br_2$, $I_2$, $NF_3$ and $XeF_2$.

11. A process as in claim 10 wherein said activation products, as provided in the reaction chamber, are electrically neutral.

12. A process as in claim 10 wherein the halosilane compound has the formula $SiX_nR_m$ where m is 0–2, n is 2–4, R is H and X is F, Cl, Br, I or mixtures thereof and the halogen gas compound is $F_2$, $ClF_3$, or a mixture of $Cl_2$ with $F_2$, $ClF_3$ or $BrF_3$.

13. A process as in claim 10 wherein the halogen gas is $F_2$.

14. A process as in claim 3 or 13 wherein the fluorine and halosilane in said gas mixture are provided at a pressure and a volume ratio relative to each other which is predetermined to avoid substantial etching of silicon form the substrate or deposition of silicon on the substrate.

15. A process as in claim 14 wherein said halosilane and said fluorine gases are provided at relative volume ratio of from 10:1 to 1:12.

16. A process as in claim 15 wherein said halosilane is a compound of the formula $SiX_nR_m$ where m is 0–2, n is 2–4, R is H and X is F, Cl, Br, I or mixures thereof.

17. A process as in claim 16 wherein m is 1–2.

18. A process as in claim 17 wherein the halosilane compound is dichlorosilane.

19. A process as in claim 16 wherein the pressure in the reactor during said steps b) and c) is maintained at between 1 mTorr and 1 Torr.

20. A process as in claim 19 wherein the substrate temperature during said steps b) and c) is maintained at between 20° C. and 100° C.

21. A process as in claim 10 wherein said activation products are produced by thermal decomposition of the gas mixture in a neutral hot beam apparatus.

22. A process as in claim 10 wherein said activation products are produced by irradiation of the gas mixture with UV light.

23. A process as in claim 10 wherein said activation products are produced upstream of the reaction chamber.

24. A process as in claim 23 wherein said activation products are produced by generating a plasma of said gas mixture and removal of ionic species therefrom upstream of the reaction chamber.

25. A process as in claims 1, 2 or 4 wherein said components i) and ii) are provided to the reaction chamber simultaneously.

26. A process as in claims 1, 2 or 4 wherein said component i) is $ClF_3$ or $XeF_2$ and said components i) and ii) are provided to the reaction chamber in a sequential treatment process, component ii) being provided first followed by component i).

* * * * *

UNITED STATES PATENT AND TRADEMARK OFFICE
CERTIFICATE OF CORRECTION

PATENT NO. : 6,083,413

DATED : July 4, 2000

INVENTOR(S) : Herbert H. Sawin, Jane P. Chang, Andrew Scott Lawing, Zhe Zhang, and Han Xu It is certified that error appears in the above-identified patent and that said Letters Patent is hereby corrected as shown below:

| | |
|---|---|
| Front of patent, #75 | Address for Jane P. Chang delete "Cambridge Mass", insert --Chathan, NJ-- |
| Col 3, line 38 | Delete "monoatornic", insert --monoatomic-- |
| Col 5, line 32 | Delete "TV", insert --UV-- |
| Col 6, line 27 | Delete "tree", insert --three-- |
| Col 7, line 17 | Insert --paragraph break-- after etched. |
| Col 9, line 17 | Insert --a period (.)-- after strike it |
| Col 10, line 57 | Insert --a period (.)-- after oxidized |
| Col 11, line 1 | Delete "dowram", insert --downstream-- |
| Col 11, line 47 | Delete "unfiled", insert --infilled-- |
| Col 11, line 52 | Delete "volatilisation", insert --volatilization-- |
| Col 11, line 59 | Delete "neural", insert --neutral-- |
| Col 12, line 4 | Delete "volatiliation", insert --volatilization-- |
| Col 12, line 5 | Delete "metal", insert --metallic-- |
| Col 12, line 24 | Delete "volatiliation", insert --volatilization-- |
| Col 12, line 34 | Delete "monoatornic", insert --monoatomic-- |

Signed and Sealed this

Seventeenth Day of April, 2001

*Attest:*

NICHOLAS P. GODICI

*Attesting Officer*   *Acting Director of the United States Patent and Trademark Office*